US006989663B2

(12) United States Patent
Nagle

(10) Patent No.: US 6,989,663 B2
(45) Date of Patent: Jan. 24, 2006

(54) FLATNESS CORRECTION

(75) Inventor: James Nagle, Austin, TX (US)

(73) Assignee: National Instruments Corporation, Austin, TX (US)

( * ) Notice: Subject to any disclaimer, the term of this patent is extended or adjusted under 35 U.S.C. 154(b) by 143 days.

(21) Appl. No.: 10/430,924

(22) Filed: May 7, 2003

(65) Prior Publication Data

US 2004/0032276 A1 Feb. 19, 2004

Related U.S. Application Data

(60) Provisional application No. 60/403,303, filed on Aug. 14, 2002.

(51) Int. Cl.
G01R 23/167 (2006.01)
G01R 1/38 (2006.01)

(52) U.S. Cl. .................... 324/76.28; 324/115

(58) Field of Classification Search ............ 324/76.28, 324/115, 121 R; 702/66
See application file for complete search history.

(56) References Cited

U.S. PATENT DOCUMENTS

| 4,897,599 | A | * | 1/1990 | Koslar ................ 324/115 |
| 5,168,213 | A | | 12/1992 | Wardle et al. |
| 5,168,459 | A | | 12/1992 | Hiller |
| 5,280,353 | A | | 1/1994 | Baldwin |
| 5,408,235 | A | | 4/1995 | Doyle et al. |
| 5,745,777 | A | | 4/1998 | English et al. |
| 5,808,574 | A | | 9/1998 | Johnson et al. |
| 5,940,143 | A | | 8/1999 | Igarashi et al. |
| 5,978,742 | A | * | 11/1999 | Pickerd .............. 702/66 |
| 5,982,824 | A | | 11/1999 | Ann |
| 6,396,428 | B1 | | 5/2002 | Cheng |
| 6,542,914 | B1 | * | 4/2003 | Pupalaikis .......... 708/300 |

OTHER PUBLICATIONS

Oppenheim, Alan V. and Ronald W. Shafer, *Discrete-Time Signal Processing*, 1989, Chapters 1, 2, 3, 7 and Appendix B.

Sedra, Adel. S. and Kenneth C. Smith, *Microelectronics Circuits*, $3^{rd}$ Edition, 1982, pp. 738-833.

Smith, Steven W., *The Scientist and Engineer's Guide to Digital Signal Processing*, $2^{nd}$ Edition, 1999, Chapters 1, 3, 4, 14-21.

* cited by examiner

Primary Examiner—Anjan Deb
Assistant Examiner—John Teresinski
(74) Attorney, Agent, or Firm—Meyertons Hood Kivlin Kowert & Goetzel, P.C.; Jeffrey C. Hood; Martin R. Wojcik

(57) ABSTRACT

A calibration system for measurement device is operable to calibrate each channel response to compensate its own gain error for a desired frequency range. The channel modes may include voltage range and a coupling mode. Each channel of the plurality of channels may have a certain number of channel mode combinations, including different voltage ranges and coupling modes. Each channel also may have a different frequency response, and as a result each channel mode combination may require an individual digital filter. As a result, the frequency response of each channel may be characterized and the digital filter may be designed to flatten each channel mode combination. The designed filter coefficients for each of the one or more channels of the plurality of channels may be stored in the measurement device. The filter coefficients may be used by a digital filter in order to compensate each one of the one or more channels on the measurement device. The calibration process may be implemented during manufacturing of the measurement device.

56 Claims, 5 Drawing Sheets

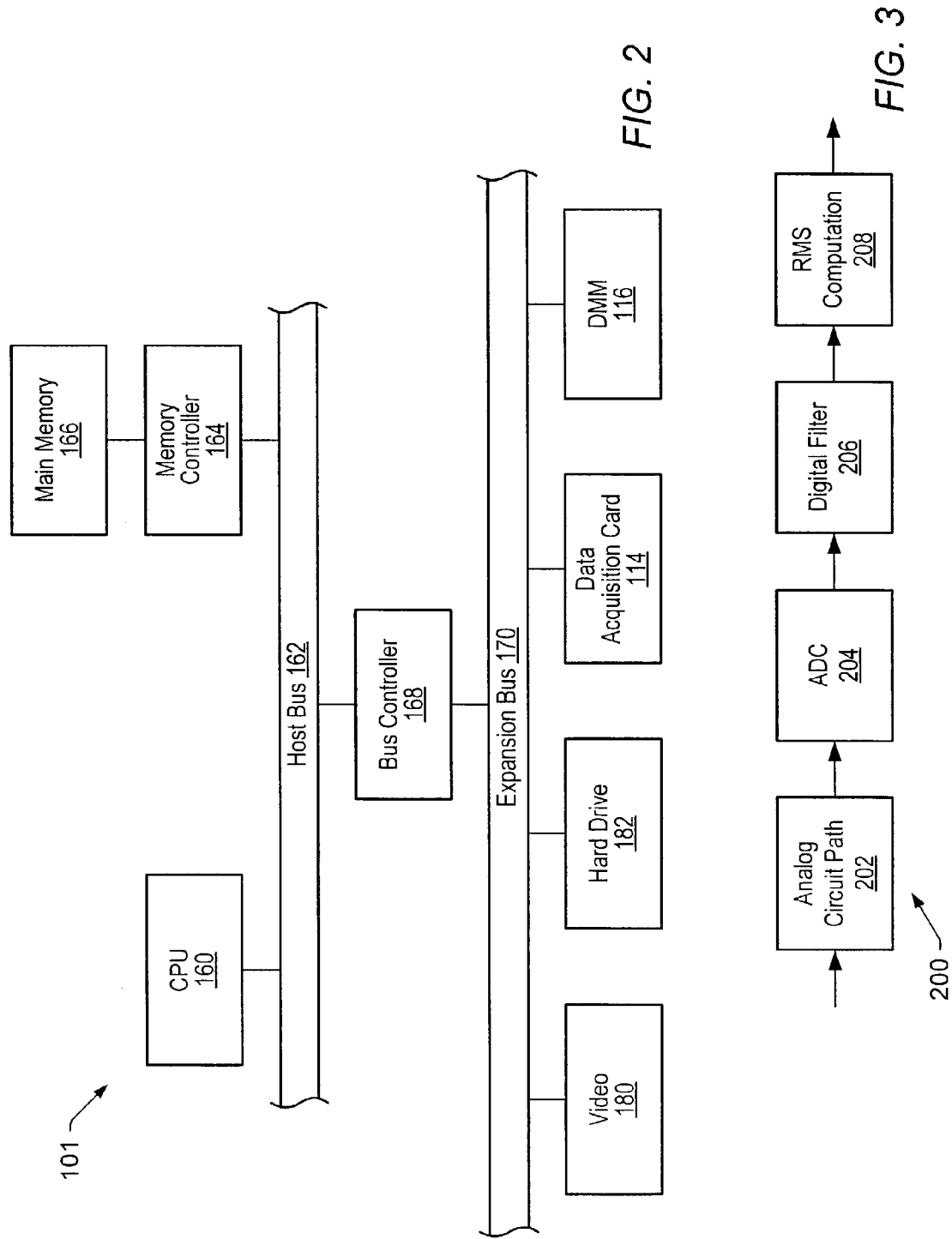

FLATNESS CORRECTION

PRIORITY CLAIM

This application claims benefit of priority of U.S. provisional application Ser. No. 60/403,303 titled "Flatness Correction" filed Aug. 14, 2002, whose inventor was James Nagle.

FIELD OF THE INVENTION

The present invention relates to the field of computer-based test systems, and more particularly to a system and method for correcting frequency response of a digital multi-meter.

DESCRIPTION OF RELATED ART

A digital multi-meter, herein referred to as a DMM, is a type of a measurement device, i.e., a piece of test equipment, used to measure voltage, current, resistance, and possibly other analog and/or digital electrical phenomena. Most DMM's are also operable to display a value of the measurement. A typical DMM may include a plurality of channels, and may be operable to measure DC voltage, AC voltage (RMS value), and resistance (ohms), besides others.

Each of the plurality of channels may be operable to measure a signal at a range of frequencies. For example, the signal may be a voltage or a current of an AC wave. The signal may be measured using root-mean-square (RMS) technique, i.e., a common mathematical method of defining the effective voltage or current of the AC wave. When measuring RMS of the signal, if the channel response is not flat, then the RMS measurement may be incorrect and/or inaccurate. A flat channel response means that the ratio of the input signal to the measured signal is constant across a desired frequency range.

Flatness correction of a channel can be defined as channel compensation operable to correct or flatten the non-flat frequency response of the channel response. For example, FIG. 1 shows an AC coupled response of a sample channel at a first voltage range with no correction. For some applications, the inaccuracy shown by this frequency response is not acceptable. This may occur in applications where there is a specification for the accuracy of the AC input signal.

For example, referring again to FIG. 1, the expected accuracy for the signal in the 100 kHz to 300 kHz range may be 5%. The expected gain of the channel response is one. The 5% error means that the gain, or response, of the channel should be between 1.05 and 0.95. However, as FIG. 1 shows, the gain of the channel varies from 1 to about 0.80. Analog sections of the measurement devices such as input amplifiers and analog filters may cause the frequency response to have an attenuated response at higher frequencies.

Related art shows use of analog techniques to correct flatness. However, analog techniques usually are difficult to calibrate and modify. Therefore it would be desirable to calibrate each channel response to compensate its own gain error for a desired frequency range. In addition, it is desirable to utilize digital compensation techniques, as these can be calibrated and changed easily. Furthermore, since the frequency response for a channel may vary between channel modes, i.e., a voltage range and coupling mode, it is desirable to design a calibration process that takes channel mode, i.e., every range and coupling mode, combination into account.

Lastly, designing digital filters for every measurement device incurs a manufacturing cost. The manufacturing cost is directly proportional to the length of the calibration procedure. Therefore, it would be advantageous to minimize the length of the calibration procedure.

SUMMARY OF THE INVENTION

The calibration process operates to create a digital filter for a measurement device. The measurement device may include a plurality of channels and each channel may have one or more channel modes, such as AC or DC coupling mode and voltage ranges, such as 0–5 V, ±5 V, and ±50 mV, among others. The measurement device is operable to measure signals in a desired frequency range. Due to physical limitations of the analog interface circuitry of the measurement device, the gain of each channel on the measurement device may be attenuated and/or may be non-linear in the desired frequency range. The calibration process generates filter coefficients for a plurality of channel and mode combinations. The filter coefficients are used by a digital filter, which is operable to compensate for the non-linearlity in the desired frequency range. The calibration process may be implemented during manufacturing of the measurement device.

The measurement device such as a DMM may include four basic units—an analog circuit path, an analog to digital converter (ADC), the digital filter, and an RMS computation unit. The four basic units may be operable to multiplex or to process one or more of the plurality of channels at the same time. The analog circuit path may include the necessary circuitry for the plurality of channels to couple to one or more analog signals. The analog circuit path may include one or more of an analog interface, analog signal conditioning, voltage isolation units, multiplexers, and analog filters, besides others. The analog circuit path may couple to the ADC. The ADC may be operable to receive the one or more analog signals from the analog circuit path and convert it to one or more digital signals.

The ADC may be coupled to the digital filter. The digital filter may be operable to correct the frequency response of the one or more digital signals using filter coefficients. The digital filter unit may produce one or more corrected digital signals, which may be propagated to an RMS computation unit. The digital filter may include one or more of a FIR filter or an IIR filter. The digital filter may also include one or more memory devices operable to store filter coefficients. The RMS computation unit may be operable to compute the RMS of the one or more corrected digital signals.

The channel modes may include voltage range and a coupling mode. Each channel of the plurality of channels may have a certain number of channel mode combinations, including different voltage ranges and coupling modes. Each channel also may have a different frequency response, and as a result each channel mode combination may require an individual digital filter. As a result, the frequency response of each channel may be characterized and the digital filter may be designed to flatten each channel mode combination. The designed filter coefficients for each of the one or more channels of the plurality of channels may be stored in the measurement device. The filter coefficients may be used by a digital filter in order to compensate each one of the one or more channels on the measurement device. The operation of the digital filter may also be verified.

BRIEF DESCRIPTION OF THE FIGURES

FIG. 2 illustrates a computer system block diagram, according to one embodiment;

FIG. 3 illustrates a simple block diagram of a measuring device, according to one embodiment;

DETAILED DESCRIPTION OF THE FIGURES

FIG. 2—Computer System Block Diagram

Figure 1:
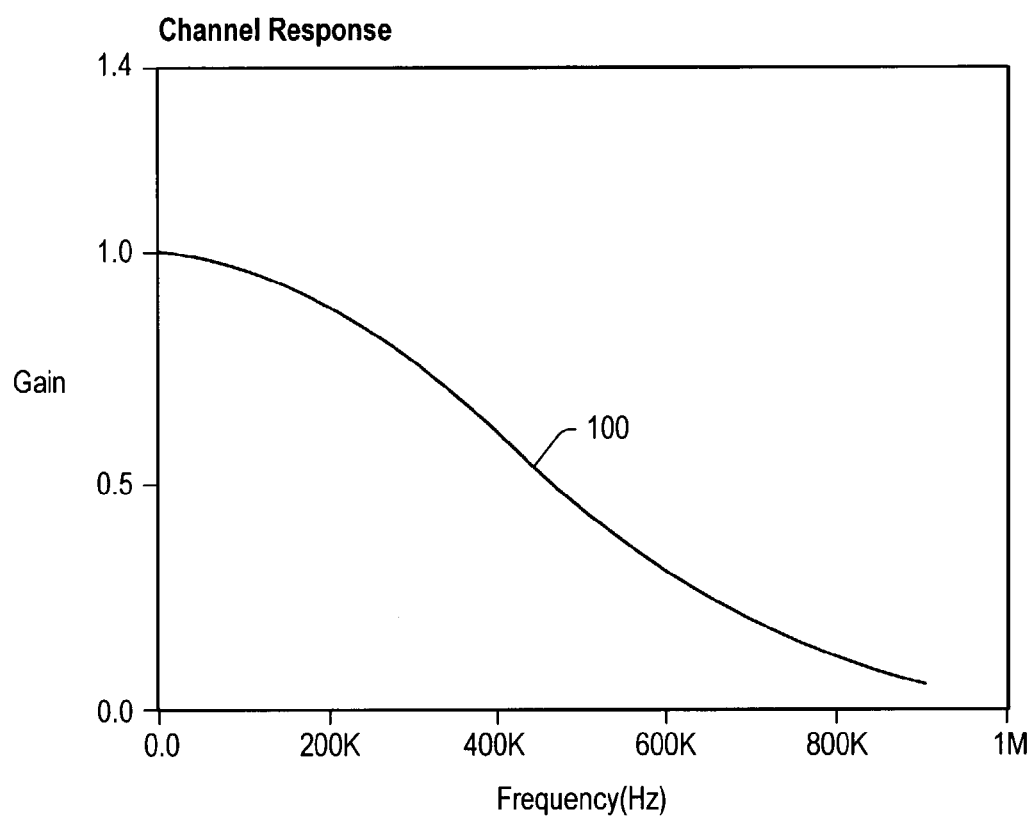
FIG. 1 illustrates a typical frequency response of a channel, according to Prior Art.

FIG. 2 is a block diagram representing one embodiment of a computer system 101. It is noted that any type of computer system configuration or architecture can be used as desired, and FIG. 2 illustrates a representative PC embodiment. It is also noted that the computer system may be a general purpose computer system, a computer implemented on a VXI card installed in a VXI chassis, a computer implemented on a PXI card installed in a PXI chassis, or other types of embodiments. Elements of a computer not necessary to understand the present description have been omitted for simplicity.

The computer may include at least one central processing unit or CPU 160 which is coupled to a processor or host bus 162. The CPU 160 may be any of various types, including an x86 processor, e.g., a Pentium class, a PowerPC processor, a CPU from the SPARC family of RISC processors, as well as others. Main memory 166 may be coupled to the host bus 162 by means of memory controller 164. The main memory 166 may store instrument drivers for communicating with DMMs, data acquisition cards, or other types of measurement devices.

The host bus 162 may be coupled to an expansion or input/output bus 170 by means of a bus controller 168 or bus bridge logic. The expansion bus 170 may be the PCI (Peripheral Component Interconnect) expansion bus, although other bus types can be used, such as ISA, VXI, PCMCIA, PC/104, PC/104+, and/or MicroDAQ. The expansion bus 170 includes slots for various devices such as measurement devices, including a data acquisition board 114 and/or a DMM 116. The computer system 101 further comprises a video display subsystem 180 and a hard drive 182 coupled to the expansion bus 170. In addition, the measurement device may be coupled to the computer system 101 by a network, such as Ethernet, USB, IEEE-1394, GPIB, RS-232/485, CAN, and/or DeviceNet, besides others.

In one embodiment, a measurement device, such as the DMM 116, may couple to a Unit Under Test, UUT (not shown). The measurement device may include a plurality of channels. Each of the channels on the measurement device may have one or more channel modes, where the mode may include coupling mode and voltage range. For example, each channel may operate in an AC or DC coupling mode. In addition, each channel may operate in one of a plurality of voltage ranges, such as ±1 Volt, ±5 Volts, and 0–5 Volts, besides others.

As noted above, various other embodiments are contemplated, such as a PXI system which includes a PXI instrument card in one or more PXI switch devices, a VXI system which includes a VXI system instrument card in one or more VXI switch devices, and other form factors including distributed I/O systems such as FieldPoint available from National Instruments.

FIG. 3—Simple Block Diagram of a Measurement Device

FIG. 3 is a simple block diagram of a measurement device, according to one embodiment.

In one embodiment, a measurement device 200 such as a DMM 116 may include four basic units—an analog circuit path 202, an analog to digital converter (ADC) 204, a digital filter 206, and an RMS computation unit 208. As described above, the measurement device 200 may include a plurality of channels, where each channel may have one or more modes. The four basic units may be operable to multiplex or to process one or more of the plurality of channels at the same time.

The analog circuit path 202 may include the necessary circuitry for the plurality of channels to couple to one or more analog signals. The analog circuit path 202 may include one or more of an analog interface, analog signal conditioning, voltage isolation units, multiplexers, and analog filters, besides others. The analog circuit path may couple to the ADC 204. The ADC may be operable to receive the one or more analog signals from the analog circuit path 202 and convert it to one or more digital signals. The one or more digital signals may have an associated frequency response associated with it, such as described below with reference to FIG. 5. Due to noise shaping of the ADC, it may be desirable to minimize the energy of a stopband, i.e., the frequency range outside a desired frequency range.

The ADC 204 may be coupled to a digital filter 206. The digital filter 206 may be operable to correct the frequency response in the desired frequency range (i.e., a passband) of the one or more digital signals using filter coefficients. The digital filter unit may produce one or more corrected digital signals, which may be propagated to an RMS computation unit 208. In one embodiment, the digital filter includes one or more of a FIR filter and an IIR filter. In one embodiment, the digital filter may include one or more memory devices (not shown) operable to store filter coefficients.

The RMS computation unit 208 may be operable to compute the RMS of the one or more corrected digital signals.

In addition, the measurement device may include one or more memory devices. The one or more memory devices may be operable to store the digital filter coefficients. The one or more memory devices may include one or more of EEPROMs, flash memory devices, and/or any other types of non-volatile memory devices.

It is noted that the block diagram of FIG. 3 is exemplary only. Further, various units of FIG. 3 may be present in different order than that shown, or may not be present, as desired. Also, various additional units may be included as desired.

Figure 4:
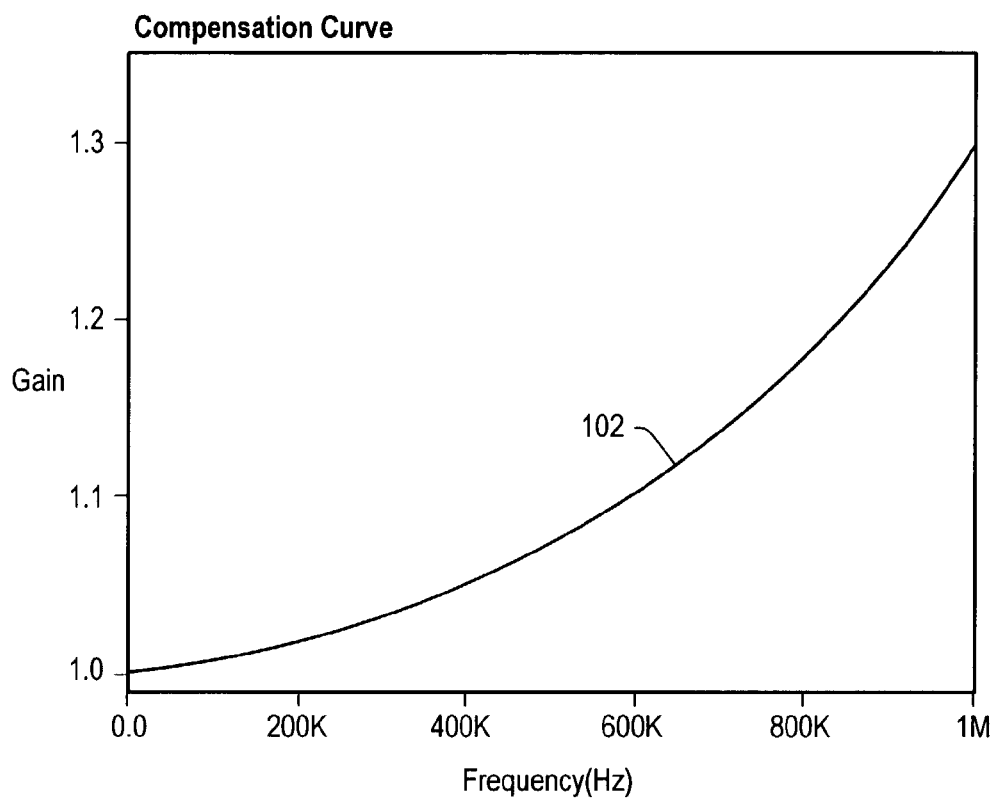
FIG. 4 illustrates a simplified compensation curve for channel response, according to one embodiment.

FIG. 4—Simplified Compensation Curve for Channel Response

FIG. 4 illustrates a simplified compensation curve for a channel response, according to one embodiment. The simplified compensation curve illustrates the gain correction of a digital filter for an input signal, such as the input signal illustrated above with reference to FIG. 1. The digital filter may be operable to convolve the input signal with the compensation curve in order to generate an output signal of a desired gain over a desired frequency. In other words, FIG. 4 shows an ideal digital filter response operable to flatten the channel response of FIG. 1 for the desired frequency range.

Figure 5:
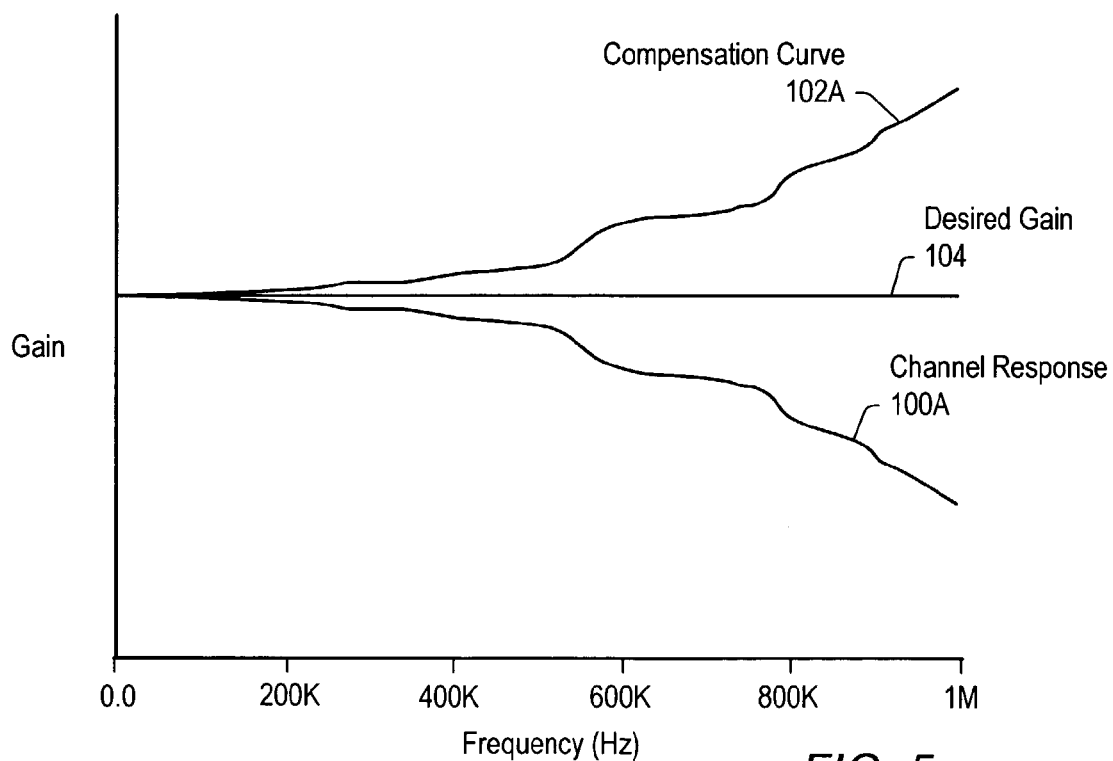
FIG. 5 illustrates a sample channel response, sample compensation, and a desired frequency response, according to one embodiment.

FIG. 5—Graph of Sample Channel Response, Sample Compensation Curve, and Desired Frequency Response FIG. 5 illustrates a sample channel response, sample compensation curve for the sample channel response, and a desired frequency response for a channel on a measurement device, according to one embodiment. In this example, an input signal has a gain of 1 across the desired frequency range. The sample channel response 100A shows an unwanted attenuation of the measured signal.

In one embodiment, a pass band frequency may include 0–300 kHz. In one embodiment, a stop band frequency may include 300 kHz–900 kHz. In one embodiment, each channel may have a desired gain in the stop band frequency and may minimize the channel response in the stop band frequency. The desired gain in the pass band frequency may be one.

In one embodiment, each one or more modes on each one of one or more of a plurality of channels on the measurement device may have a different channel response. Therefore it may be necessary to have a separate compensation curve for each one or more modes on the one of one or more of the plurality of channels on the measurement device in order to achieve the desired gain over the desired frequency.

Figure 6:
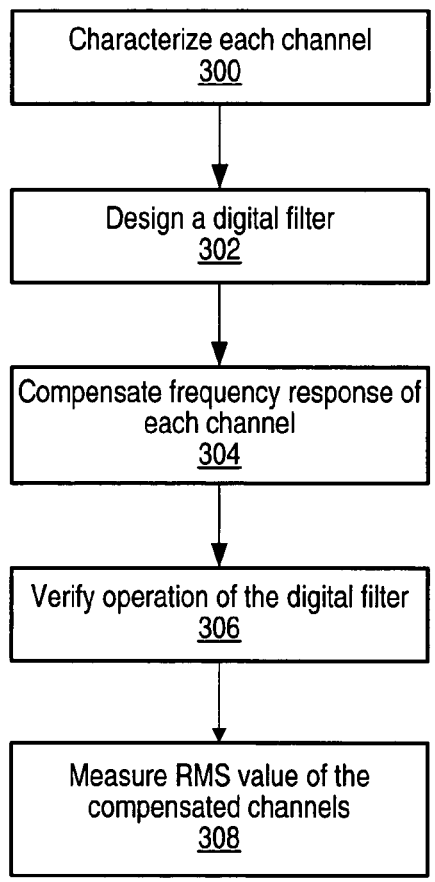
FIG. 6 is a flowchart of a method for calibrating frequency response of a measurement device, according to one embodiment.

FIG. 6—Flowchart of Calibrating Frequency Response of a Measurement Device

FIG. 6 is a flowchart of calibrating frequency response of a measurement device, according to one embodiment.

A measurement device may include a plurality of channels at one or more channel modes. The one or more channel modes may include voltage range and a coupling mode. Each channel of the plurality of channels may have a plurality of channel mode combinations, including different voltage ranges and coupling modes. Each channel also may have a distinct frequency response, and as a result each channel mode combination may require a separate digital filter. As a result, the frequency response of each channel may be characterized and the digital filter may be designed to flatten each channel mode combination.

In 300, each one of a plurality of channels on the measurement device may be characterized. The characterization of channels may generate filter coefficients. The designed filter coefficients for each of the one or more channels of the plurality of channels may be stored in the measurement device. Each one of the one or more of the plurality of channels may include one or more channel modes. Each channel mode can be characterized by one or more of a voltage range and a coupling mode. Furthermore, the coupling mode may include one of AC coupling and DC coupling. The voltage range may include one of a plurality of voltage ranges, such as 0–5 V, ±5 V, and ±50 mV, among others. The characterizing of each one of the plurality of channels 300 is described in more detail below with reference to FIG. 7.

In 302, the filter coefficients may be used by a digital filter. The digital filter may include an FIR filter and/or an IIR filter, among others. In one embodiment, the length of the digital filter may be 12 taps.

In 304, the frequency response of each one of the one or more channels on the measurement device may be compensated using the digital filter. An example of compensating the frequency response of the measurement device is described above with reference to FIG. 5. The digital filter may be operable to compensate the frequency response of each one of the one or more channels on the measurement device.

In 306, the operation of the digital filter may be verified. In other words, the frequency response of each one of the one or more channels on the measurement device may be verified for the desired frequency gain over the desired frequency range.

It is noted that the flowchart of FIG. 6 is exemplary only. Further, various steps in the flowchart of FIG. 6 may occur concurrently or in different order than that shown, or may not be performed, as desired. Also, various additional steps may be performed as desired.

Figure 7:
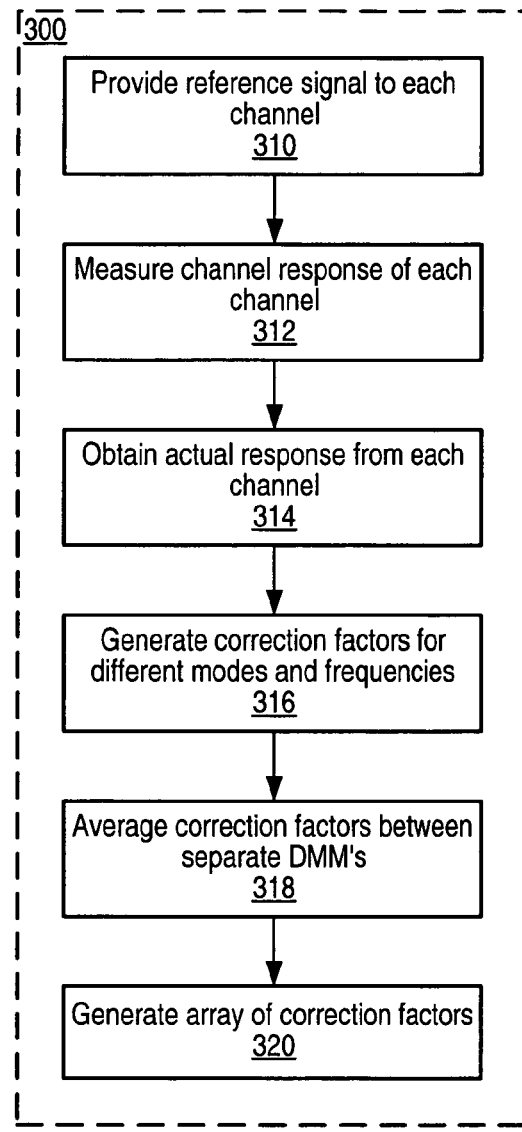
FIG. 7 is a detailed flowchart of a method for characterizing channels and designing a digital filter, according to one embodiment.

FIG. 7—Detailed Flowchart of Characterizing Channels and Designing a Digital Filter FIG. 7 is a detailed flowchart of characterizing channels and designing a digital filter, according to one embodiment. The flowchart of FIG. 7 may explain characterizing of each one of the plurality of channels 300 of FIG. 6 in more detail.

In 310, a reference signal may be provided to each one of one or more of a plurality of channels on the measurement device in order to characterize the frequency response of each channel. Each one of the one or more of the plurality of channels comprises an input and an output. In one embodiment, the reference signal provided to each one of the one or more of the plurality of channels may include a stepped sinusoidal sweep signal. In other embodiments, the reference signal may include one or more of a stepped square wave sweep and any other type of a periodic signal. In yet other embodiments, the reference signal may include one or more of a single step or any other type of a non-periodic signal.

The reference signal may be provided to the input of each one of the one or more of the plurality of channels in order to generate a channel response from each one of the one or more of the plurality of channels. The reference signal may include a set of predefined frequencies and amplitudes. For example, the reference signal generated for the 5V range may have an amplitude of 5V. The reference signal may be generated by an external calibration unit or a built-in calibration unit. The calibration unit may produce the reference signal of the predefined frequency and amplitude with a very high degree of accuracy. In addition, to minimize time of the calibration process, the reference signal may use as few frequencies as possible.

In 312, a channel response may be measured by measuring the response of each one of the one or more of the plurality of channels to the reference signal. In one embodiment, referring to FIG. 3, the output of the RMS Computation unit 208 may be measured to obtain the RMS value of the channel response of each one of the one or more of the plurality of channels to the reference signal. The channel response may be generated at the output of each one of the one or more of the plurality of channels.

In 314, an actual response may be calculated for each channel. In one embodiment, the actual response is substantially equal to the channel response divided by the reference signal. In other words, the actual response is a ratio of the output to the input, and it indicates the gain of the channel. For a flat frequency response, the actual response will be flat over a desired frequency range. The goal of the digital filter is to compensate the frequency response of each one of the one or more of the plurality of channels to make the actual response flat over a desired frequency range. In one embodiment, the actual response of each one of the one or more of the plurality of channels is operable to show any non-linearity in the frequency response of each one of the one or more of the plurality of channels.

In 316, the calibration algorithm may generate correction factors. Each correction factor relates the actual response of a first channel at a first mode to an actual response of the first channel at a second mode, both actual responses measured at a first frequency. For example, the correction factor may relate the actual response of the first channel, DC coupled, at 5 Volts, to the actual response of the first channel, AC coupled, also at 5 Volts. In other words, the correction factor may be used to calculate the actual response of the first channel at the second mode without providing a reference signal to the first channel at the second mode, where the actual response of the first channel at the first mode and the second mode are both measured at the first frequency. As a result, for the same coupling mode, the actual response at the second voltage range and the actual response at a third voltage range may be computed from the actual response at the first voltage range.

In step 318, a plurality of correction factors may be generated for a plurality of measurement devices. Between measurement devices using the same channel mode configuration, the plurality of correction factors for the corresponding channels may be averaged together in order to obtain an accurate value of the correction factors.

In other words, the relative amplitude of actual responses taken at the first voltage range, the second voltage range, and the third voltage range for the same mode and different measurement devices may be relatively constant. For example, for a first frequency at a first coupling mode, the ratio of the actual response measured at the first voltage range to the actual response measured at the second voltage range may be constant across measurement devices. By using several measurement devices and characterizing the actual responses of combinations of voltage ranges, coupling modes, and frequencies, a correction factor may be computed that will allow the response of one range (at first frequency) to be computed by a simple scaling of the response of another range, also at first frequency.

An array of correction factors may be generated 320, where the array of correction factors may relate the actual response of one or more modes of each channel to each other at one or more frequencies. This array of correction factors may be operable to generate the actual channel response for each one of the one or more of the plurality of channels at the one or more modes. In other words, the array of correction factors may be used to generate the actual channel response of each one of the one or more of the plurality of channels at the one or more modes without generating the reference signal and measuring the channel response of each one of the one or more of the plurality of channels at the one or more modes.

For example, the array of correction factors may include correction factors relating the first channel at a first channel mode to the first channel at a second channel mode across a plurality of pre-selected frequencies, such as the frequencies generated in the reference signal in 310. In addition, the array of correction factors may include a sequence of correction factors that allow the computation of the AC coupled ranges from the DC coupled ranges. The array of correction factors may be used in the flatness calibration during manufacturing of the measurement devices, such as described below with reference to FIG. 8.

It is noted that the flowchart of FIG. 7 is exemplary only. Further, various steps in the flowchart of FIG. 7 may occur concurrently or in different order than that shown, or may not be performed, as desired. Also, various additional steps may be performed as desired.

Figure 8:
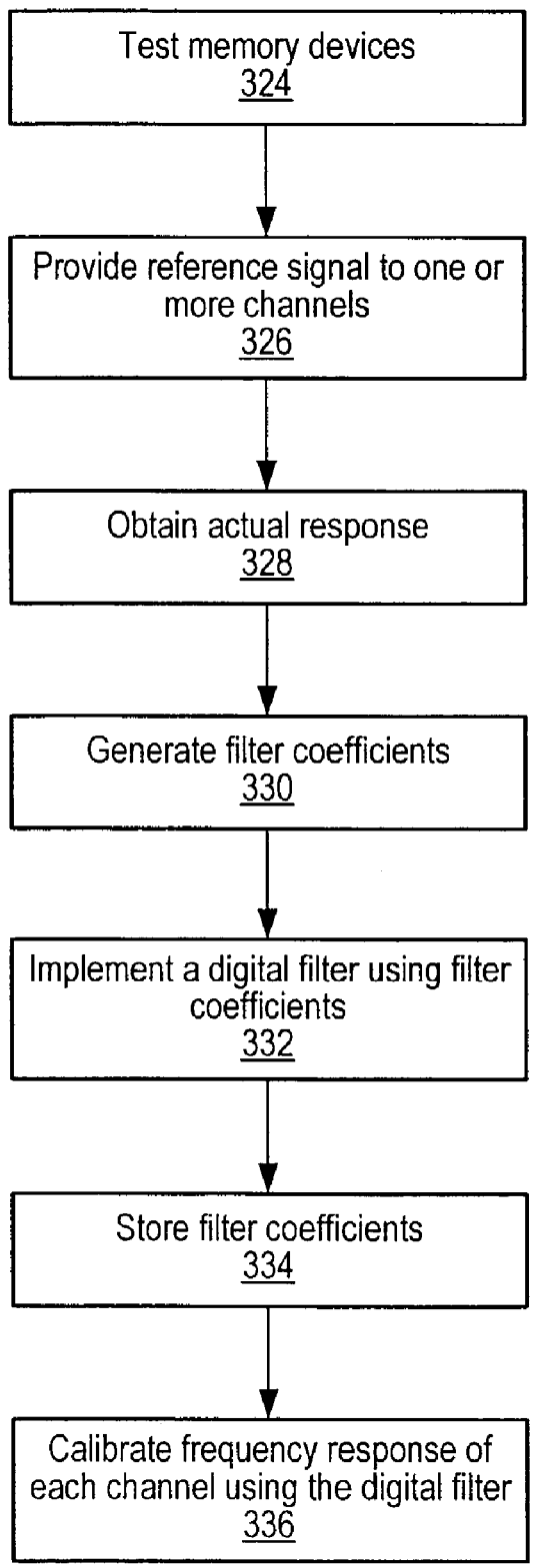
FIG. 8 is a flowchart of a method for calibrating of a measurement device, according to one embodiment.

FIG. 8—Calibration of a Measurement Device

FIG. 8 is a flowchart of calibration of a measurement device, according to one embodiment. Calibration of a measurement device may be usable by a manufacturing calibration process in order to accurately calibrate a plurality of measurement devices.

In 324, an initial set of coefficients may be written to one or more memory devices on the measurement device. The initial set of coefficients may be written to test whether the write and read operations work to/from the one or more memory devices.

In 326, a reference signal may be provided to one or more of a plurality of channels on the measurement device. In one embodiment, the reference signal provided to the one or more channels may include a stepped sinusoidal sweep signal. Each one of the one or more channels may comprise an input and an output. The reference signal may be provided to the input of the one or more channels in order to generate a channel response from the one or more channels. The reference signal may include a set of predefined frequencies and amplitudes. In one embodiment, the reference signal may be provided only to two channels out of the plurality of channels on the measurement device. In other embodiments, the reference signal may include one or more of a stepped square wave sweep and any other type of a periodic signal. In yet other embodiments, the reference signal may include one or more of a single step or any other type of a non-periodic signal.

In 328, an actual response may be obtained for each one of the one or more of the plurality of channels. In one embodiment, in 326 a channel response was obtained for the one or more channels only. The channel response for the one or more channels may be used with one or more correction factors to generate an actual response for each one of the one or more of the plurality of channels. The one or more correction factors may be included in an array of correction factors, such as referenced above in 320 of FIG. 7.

For example, the calibration procedure may only characterize the first voltage range and the second voltage range at a first mode across a plurality of pre-selected frequencies, such as the frequencies generated by the reference signal. The rest of the actual responses may be generated by using the array of correction factors. In another embodiment, in 326 a channel response may be generated for all channel modes on all channels of the plurality of channels. However, this embodiment may be more expensive in terms of calibration time.

In 330, the measurement device may generate filter coefficients produced by a process such as one described above with reference to FIGS. 6 and 7. The digital filter coefficients used by the digital filter may be generated using the desired filter response and one or more of an Equal-Ripple filter design, Parks filter design, and/or least-squares filter design. In 332, the digital filter may be implemented using the desired filter response.

In 334, the filter coefficients, also referred to as calibration coefficients, may be stored in one or more memory devices, such as EEPROMs, flash memory devices. and/or any other type of a non-volatile memory device.

In 336, the frequency response of each channel on the measurement device may be compensated by the digital filter. Specifically, the one or more channel modes on each one of the one or more of the plurality of channels on the measurement device may be compensated using the digital filter to have a desired gain over a desired frequency range.

It is noted that the flowchart of FIG. 8 is exemplary only. Further, various steps in the flowchart of FIG. 8 may occur concurrently or in different order than that shown, or may not be performed, as desired. Also, various additional steps may be performed as desired.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A multi-stage method for compensating frequency response of a DMM, wherein the DMM comprises a plurality of channels, wherein each one of one or more of the plurality of channels comprises one or more channel modes, the method comprising:
    characterizing each one of the one or more of the plurality of channels;
    designing a digital filter, wherein said designing the digital filter comprises calculating filter coefficients for each one of the one or more of the plurality of channels;
    compensating frequency response of each one of the one or more of the plurality of channels using the digital filter; and
    measuring an RMS value of one or more signals using the one or more of the plurality of compensated channels.

2. The multi-stage method of claim 1, wherein each channel mode can be characterized by one or more of a voltage range and a coupling mode.

3. The multi-stage method of claim 2, wherein the coupling mode comprises one of AC coupling and DC coupling.

4. The multi-stage method of claim 2, wherein the voltage range comprises one of a plurality of voltage ranges.

5. The multi-stage method of claim 1, wherein said compensating the frequency response of the DMM comprises calibrating each one of the one or more of the plurality of channels using the filter coefficients prior to said measuring.

6. The multi-stage method of claim 1. wherein said compensating the frequency response of each one of the one or more of the plurality of channels comprises achieving a desired gain across a desired frequency range.

7. The multi-stage method of claim 6, wherein the desired frequency range comprises a pass band frequency for each one of the one or more of the plurality of channels.

8. The multi-stage method of claim 6, wherein the desired gain comprises unity gain for each one of the one or more of the plurality of channels.

9. The multi-stage method of claim 1, wherein the digital filter comprises one or more of the following:
    a FIR filter; and
    an IIR filter.

10. The multi-stage method of claim 1, wherein said compensating the frequency response of each one of the one or more of the plurality of channels comprises minimizing noise in a stop band frequency for each one of the one or more of the plurality of channels.

11. The multi-stage method of claim 1, further comprising:
    obtaining an actual response for each of the one or more of the plurality of channels, wherein said characterizing each one of the one or more of the plurality of channels comprises obtaining calculating a desired filter response for each one of the one or more modes for each of the one or more of the plurality of channels by using the actual response; and
    calculating the filter coefficients using the desired filter response.

12. The multi-stage method of claim 11, wherein said calculating the desired filter response comprises calculating the desired filter response to be substantially equal to the inverse of the actual response.

13. The multi-stage method of claim 11, wherein said calculating the filter coefficients comprises using one or more of an Equal-Ripple filter design, and least-squares filter design.

14. The multi-stage method of claim 11, wherein said obtaining the actual response comprises providing a reference signal to each one of the one or more of the plurality of channels and measuring a corresponding channel response of each one of the one or more of the plurality of channels to the reference signal.

15. The multi-stage method of claim 14, wherein said characterizing the frequency response further comprises generating a correction factor, wherein the correction factor relates an actual response of a first channel at a first mode to an actual response of the first channels at a second mode, both at a first frequency.

16. The multi-stage method of claim 14, wherein the actual response of each one of the one or more of the plurality of channels is substantially equal to the reference signal provided to each one of the one or more of the plurality of channels divided by the corresponding channel response of each one of the one or more of the plurality of channels.

17. The multi-stage method of claim 14, wherein the reference signal is provided by one or more of:
    an external calibration unit; and
    a built-in calibration unit.

18. The multi-stage method of claim 11, wherein said characterizing the frequency response further comprises generating a correction factor, wherein the correction factor relates an actual response of a first channel at a first mode to an actual response of the first channel at a second mode, both at a first frequency.

19. The multi-stage method of claim 18, generating a plurality of correction factors for one or more DMM's;
    wherein the plurality of correction factors for corresponding one or more of the plurality of channels at corresponding one or more modes on the one or more DMM's may be averaged together.

20. The multi-stage method of claim 18, further comprising:
    generating an array of correction factors;
    wherein the array of correction factors is operable to relate the actual response of one or more modes of each one of the one or more of the plurality of channels to each other at one or more frequencies.

21. The multi-stage method of claim 20, wherein the array of correction factors is operable to generate the actual channel response for each one of the one or more of the plurality of channels at the one or more modes.

22. The multi-stage method of claim 11, wherein the actual response of each one of the one or more of the plurality of channels is operable to show any non-linearity in the frequency response of each one of the one or more of the plurality of channels.

23. The multi-stage method of claim 11, wherein each one of the one or more of the plurality of channels comprises an input and an output; wherein said characterizing each one of the one or more of the plurality of channels comprises providing a reference signal to the input of each one of the one or more of the plurality of channels in order to generate the actual response, wherein the reference signal comprises a set of predefined frequencies and amplitudes; and wherein a channel response is generated at the output of each one of the one or more of the plurality of channels.

24. The multi-stage method of claim 23, wherein the reference signal comprises one or more of:
a stepped sinusoidal sweep;
a stepped square wave sweep; and
any other type of a periodic signal.

25. The multi-stage method of claim 23, wherein the reference signal comprises one or more of:
a single step; and
any other type of a non-periodic signal.

26. The multi-stage method of claim 1, further comprising:
calibrating the DMM;
wherein said calibrating the DMM further comprises using the filter coefficients and measuring accuracy of each one of the one or more of the plurality of channels.

27. The multi-stage method of claim 26, wherein the one or more memory devices comprise one or more of:
one or more EEPROMs;
one or more flash memory devices; and
one or more of any other type of a non-volatile memory device.

28. The multi-stage method of claim 26, wherein said calibrating the DMM comprises testing the one or more memory devices.

29. The multi-stage method of claim 26, wherein the DMM comprises one or more memory devices; wherein said using calibration coefficients comprises writing calibration coefficients to the one or more memory devices.

30. The multi-stage method of claim 1, further comprising:
verifying the frequency response of each one of the one or more of the plurality of channels, wherein said verifying the frequency response comprises using the filter coefficients.

31. The multi-stage method of claim 1, wherein the DMM is coupled to a computer system using a bus, wherein the bus comprises one or more of:
a computer bus comprising at least one of an ISA bus, a PCI bus, a PXI bus, a VXI bus, a PCMCIA bus, a MicroDAQ bus, a PC/104 bus, and a PC/104+ bus; and
a network bus comprising at least one of Ethernet, USB, IEEE-1394, GPIB, RS-232, RS-485, CAN, and DeviceNet.

32. A system for calibrating a digital multi-meter (DMM), wherein the system comprises:
a DMM, wherein the DMM comprises:
a plurality of channels; and
a digital filter operable to use filter coefficients, wherein the digital filter is further operable to compensate frequency response of each one of one or more of the plurality of channels; and
a calibration unit, wherein the calibration unit is operable to generate a reference signal to one or more channels of plurality of channels or the DMM,
wherein the DMM is operable to measure an RMS value of one or more signals using the one or more of the plurality of compensated channels.

33. The system of claim 32, wherein each one of one or more of the plurality of channels comprises one or more channel modes.

34. The system of claim 32, wherein each channel mode can be characterized by one or more of a voltage range and a coupling mode.

35. The system of claim 34, wherein the coupling mode comprises one of AC coupling and DC coupling.

36. The system of claim 34, wherein the voltage range comprises one of a plurality of voltage ranges.

37. The system of claim 32, wherein said compensating the frequency response of each one of the one or more of the plurality of channels comprises achieving a desired gain across a desired frequency range.

38. The system of claim 37, wherein the desired frequency range comprises a pass band frequency for each one of the one or more of the plurality of channels.

39. The system of claim 37, wherein the desired gain comprises unity gain for each one of the one or more of the plurality of channels.

40. The system of claim 32, wherein each one of the one or more of the plurality of channels comprises an input and an output; wherein the DMM is operable to generate an actual response for each one of the one or more of the plurality of channels.

41. The system of claim 40, wherein said generating the actual response comprises providing a reference signal to the input of one or more of the plurality of channels in order to generate the actual response, wherein the reference signal comprises a set of predefined frequencies and amplitudes; and wherein a channel response is generated at the output of one or more of the plurality of channels.

42. The system of claim 41, wherein the reference signal comprises one or more of:
a stepped sinusoidal sweep;
a stepped square wave sweep; and
any other type of a periodic signal.

43. The system of claim 41, wherein the reference signal comprises one or more of:
a single step; and
any other type of a non-periodic signal.

44. The system of claim 41,
wherein the measurement device is operable to obtain one or more correction factors to generate an actual response for each one of the one or more of the plurality of channels.

45. The system of claim 41,
wherein the measurement device is further operable to generate desired filter response, wherein the desired filter response is substantially equal to the inverse of the actual response.

46. The system of claim 45,
wherein the measurement device is further operable to generate the filter coefficients from the desired filter response;
wherein said generating the filter coefficients comprises using one or more of an Equal-Ripple filter design, Parks filter design, and least-squares filter design.

47. The system of claim 32,
wherein said compensating the frequency response of each one of the one or more of the plurality of channels further comprises minimizing noise in a stop band frequency for the each one of the one or more of the plurality of channels.

48. The system of claim 32,
wherein the digital filter comprises one or more of the following:
 a FIR filter; and
 an IIR filter.

49. The system of claim 32,
wherein said compensating the frequency response of each one of the one or more of the plurality of channels further comprises using the digital filter for each one of the one or more of the plurality of channels and measuring accuracy of each one of the one or more of the plurality of channels.

50. The system of claim 32,
wherein the DMM further comprises one or more memory devices;
wherein said calibrating comprises writing filter coefficients to the one or more memory devices.

51. The system of claim 50, wherein the one or more memory devices comprise one or more of:
 one or more EEPROMs;
 one or more flash memory devices; and
 one or more of any other type of a non-volatile memory device.

52. The system of claim 50,
wherein said compensating the frequency response of each one of the one or more of the plurality of channels comprises testing the one or more memory devices.

53. The system of claim 32,
wherein the system is usable in a manufacturing calibration procedure for a plurality of DMM's.

54. The system of claim 32,
wherein the DMM comprises one or more of:
 a digital multi-meter;
 a digital volt-meter; and
 any measuring instrument operable to couple to a computer system using a bus.

55. The system of claim 54,
wherein the bus comprises one or more of:
 a computer bus comprising at least one of an ISA bus, a PCI bus, a PXI bus, a VXI bus, a PCMCIA bus, a MicroDAQ bus, a PC/104 bus, and a PC/104+ bus; and
 a network bus comprising at least one of Ethernet, USB, IEEE-1394, GPIB, RS-232, RS-485, CAN, and DeviceNet.

56. A multi-stage method for compensating frequency response of a measuring device, wherein the measuring device comprises a plurality of channels, wherein one or more of the plurality of channels comprises one or more channel modes, the method comprising:
 characterizing the one or more of the plurality of channels, wherein said characterizing comprises obtaining an actual response for the one or more of the plurality of channels;
 designing a digital filter, wherein said designing comprises calculating a desired filter response for the one or more channel modes for the one or more of the plurality of channels by using the actual response, wherein said designing further comprises calculating filter coefficients for the one or more of the plurality of channels using the desired filter response;
 compensating frequency response of the one or more of the plurality of channels using the digital filter; and
 measuring an RMS value of one or more signals using the one or more of the plurality of compensated channels;
 wherein a correction factor is operable to generate the actual response of a first channel at a first mode from the actual response of the first channel at a second mode.

* * * * *

UNITED STATES PATENT AND TRADEMARK OFFICE
CERTIFICATE OF CORRECTION

PATENT NO. : 6,989,663 B2  Page 1 of 1
APPLICATION NO. : 10/430924
DATED : January 24, 2006
INVENTOR(S) : James C. Nagle It is certified that error appears in the above-identified patent and that said Letters Patent is hereby corrected as shown below:

In the Claims:

Column 10
Line 9, please delete "comprises obtaining calculating a desired filter" and substitute -- comprises said obtaining; calculating a desired filter --;
Line 11, please delete "each of the one or more of the plurality of channels by" and substitute -- each of the one or more channels of the plurality of channels by --.

Column 12
Line 14, please delete "channels or the DMM" and substitute -- channels on the DMM --;
Line 21, please delete "The system of claim 32," and substitute -- The system of claim 33, --.

Signed and Sealed this

Fifth Day of February, 2008

JON W. DUDAS
*Director of the United States Patent and Trademark Office*